United States Patent
Topp et al.

(10) Patent No.: US 7,057,240 B2
(45) Date of Patent: Jun. 6, 2006

(54) SEMICONDUCTOR CIRCUIT, ESPECIALLY FOR IGNITION PURPOSES, AND THE USE OF THE SAME

(75) Inventors: Rainer Topp, Reutlingen (DE); Horst Meinders, Reutlingen (DE); Wolfgang Feiler, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 175 days.

(21) Appl. No.: 10/433,848

(22) PCT Filed: Sep. 30, 2002

(86) PCT No.: PCT/DE02/03700

§ 371 (c)(1),
(2), (4) Date: Nov. 12, 2003

(87) PCT Pub. No.: WO03/034590

PCT Pub. Date: Apr. 24, 2003

(65) Prior Publication Data

US 2004/0075103 A1 Apr. 22, 2004

(30) Foreign Application Priority Data

Oct. 9, 2001 (DE) .............................. 101 49 777

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .................. 257/370; 257/368; 257/467

(58) Field of Classification Search ................ 257/368, 257/370, 467
See application file for complete search history.

(56) References Cited

U.S. PATENT DOCUMENTS 5,379,178 A 1/1995 Schwenger et al.

(Continued)

FOREIGN PATENT DOCUMENTS

DE 31 10 230 1/1982

(Continued)

OTHER PUBLICATIONS

Shen et al., *IEEE Electron Device Letters*, vol. 21, No. 3, Mar. 2000, pp. 119-122.

(Continued)

*Primary Examiner*—Ngân V. Ngô
(74) *Attorney, Agent, or Firm*—Kenyon & Kenyon

(57) ABSTRACT

A semiconductor circuit configuration is described, in particular for ignition applications, having a semiconductor power switching device which has a first main terminal, a second main terminal and a control terminal; a clamping diode device which is switched between the first main terminal and the control terminal for clamping an external voltage ($V_A$) which is applied at the first main terminal; the clamping diode device having a first part with a first clamp voltage and a second part with a second clamp voltage ($V_{KL}'$), the second part being connected in series with the first part; a controllable semiconductor switching device which is connected in parallel with the first part for controllable bridging of the first part, so that either the sum ($V_{KL}$) of the first and the second clamp voltages, or the second clamp voltage ($V_{KL}'$) is provided for clamping the external voltage ($V_A$) applied at the first main terminal; and a control circuit for controlling the controllable semiconductor switching device as a function of a predetermined operating state of the semiconductor power switching device.

7 Claims, 7 Drawing Sheets

U.S. PATENT DOCUMENTS

| | | |
|---|---|---|
| 5,569,982 A | 10/1996 | Nadd |
| 6,087,877 A | 7/2000 | Gonda et al. |
| 6,218,709 B1 * | 4/2001 | Yasuda ........................ 257/378 |
| 2002/0167056 A1 * | 11/2002 | Sakamoto ................... 257/368 |

FOREIGN PATENT DOCUMENTS

| | | |
|---|---|---|
| DE | 197 42 019 | 3/1999 |
| DE | 198 38 389 | 3/2000 |

OTHER PUBLICATIONS

Shen et al., *PCIM '96, Conf. Proc.*, May 1996, pp. 11-16.
Laska et al., *Solid-State Electronics*, vol. 35, No. 5, Pergamon Press, May 1992, pp. 681-685.
Omura et al., *ISPSD '97, Conf. Proc.*, Weimar, Germany, May 26-29, 1997, pp. 217-220.
Yedinak et al., *ISPSD '98, Conf. Proc.*, Japan, Jun. 3-6, 1998, pp. 399-402.

* cited by examiner

# SEMICONDUCTOR CIRCUIT, ESPECIALLY FOR IGNITION PURPOSES, AND THE USE OF THE SAME

This application is a 371 of PCT/DE02/0370009 filed on Sep. 30, 2002.

FIELD OF THE INVENTION

The present invention relates to a semiconductor circuit configuration, in particular for ignition applications.

BACKGROUND INFORMATION

Although it is also applicable to other similar semiconductor components, the present invention as well as the problems on which it is based are explained here with regard to a vertical IGBT (insulated gate bipolar transistor) for ignition applications.

IGBTs are used in general as power switching devices in the range of a blocking voltage of a few hundred volts up to a few thousand volts. In particular, the use of such IGBTs as ignition transistors, i.e., as switches on the primary side of an ignition coil, is of particular interest.

The structure of a vertical IGBT is similar to that of a VDMOS transistor, with the difference that a $p^+$-emitter is situated on its anode side instead of an $n^+$-substrate as in the VDMOS transistor. German Patent No. 31 10 230 describes a vertical MOSFET component having the basic structure of a vertical IGBT.

In principle, two types of vertical IGBT or V-IGBT are differentiated, namely a punch-through IGBT (PT) and a non-punch-through IGBT (NPT), as described by Laska et al., *Solid-State Electronics*, volume 35, no. 5, pp. 681–685, for example.

The basic properties of these two types of IGBTs are described below with reference to FIG. 6.

FIG. 6 shows a schematic cross-sectional diagram of a known PT-IGBT or NPT-IGBT, labeled in general with reference number 100.

A PT-IGBT is usually produced on a thick $p^+$-doped substrate having an epitaxially applied $n^-$-buffer layer 140 and an $n^-$-drift region 104, which is also applied epitaxially. For the smallest possible conducting state voltage drop, the thickness of $n^-$-drift region 104 is selected to be smaller than required by the width of the space charge region in $n^-$-drift region 104 at the desired blocking ability, so n-buffer layer 140 has the function of preventing punch-through of the space charge region to rear $p^+$-emitter 105 which is provided in the substrate. To achieve a rapid shutdown of the electric current despite a good $p^+$-emitter 105, the carrier lifetime is kept small by lifetime killing, e.g., by radiation, and/or the doping of n-buffer layer 140 is selected to be high accordingly. Since the conducting state voltage becomes greater with an increase in the doping dose of n-buffer layer 140, a good compromise between conducting-state behavior and shutdown behavior is to be achieved with a thin, highly doped n-buffer layer 140.

An NPT-IGBT is derivable from the PT-IGBT by omitting n-buffer layer 140 and selecting a greater thickness for drift region 104 than that required by the width of the space charge region at the desired blocking ability. The NPT-IGBT is usually produced on a low-doped substrate having a high charge carrier lifetime, whereby after introducing the diffusion profiles on the front side of the wafer, a shallow $p^+$-emitter 105 having a depth of penetration of only a few μm (much less than 20 μm) and a poor emitter efficiency is produced on the rear side of the wafer. Such a transparent $p^+$-emitter 105 is used to ensure a rapid shutdown of the current in dynamic operation of the component with the goal of minimizing shutdown losses. To achieve satisfactory conducting state properties despite the poor $p^+$-emitter 105, the carrier lifetime in $n^-$-drift region 104 must be selected to be as high as possible, and furthermore, the thickness of $n^-$-drift region 104 is to be selected to be as low as possible, taking into account the desired blocking ability of the component.

On the front side, a PT-IGBT or NPT-IGBT is composed of an active region 130 and an edge termination region 150, the latter ensuring the desired blocking ability with respect to the edge of the chip. Active region 130 is composed of a plurality of cell-shaped or strip-shaped MOS control heads 106, 107, 108 connected in parallel. These MOS control heads 106, 107, 108 are explained in greater detail below in conjunction with the functioning of vertical IGBTs.

MOS control heads 106, 107, 108 are obtained by continued reflection of the half-cell on section AA' shown between sections AA' and BB' in FIG. 6. Magnetoresistive structures are conventionally used in edge area 150 to achieve the desired blocking ability. These magnetoresistive structures are usually composed of a cathode 101, designed as a metal magnetoresistor, a polysilicon magnetoresistor 153a, which is electrically connected to the former via the third dimension (not shown), a metal plating 152 connected to an $n^+$-channel stopper 155 and a polysilicon magnetoresistor 153b, which is electrically connected to metal plating 152 via the third dimension (not shown). Also shown are a field oxide 159 and an intermediate dielectric 110, which, in addition to specific contacting, has the function of electrically insulating the metal plating plane from the polysilicon plane.

The functioning of an NPT-IGBT or PT-IGBT in the conducting state is explained first in greater detail below.

A gate 103, which is usually made of polysilicon and is insulated from the semiconductor body by a thin gate oxide layer 109, is brought to a potential above the threshold voltage of MOS control heads 106, 107, 108 with respect to cathode 101. Then an inversion channel is created on the semiconductor surface beneath gate 103 in the area of p-body region 108, whereupon the semiconductor surface is in a state of accumulation in the area of n-drift region 104. When there is a positive voltage on anode 102 relative to cathode 101, electrons are injected into $n^-$-drift region 104 via $n^+$-source region 106, the MOS channel thus influenced, and the accumulation layer. Then $p^+$-emitter 105 on the anode side injects holes, so that $n^-$-drift region 104 is flooded by charge carriers and its conductivity is increased in active region 130 and in adjacent portions of edge termination 150. These portions are in high injection at the usual conducting state current densities. Therefore, an IGBT having a blocking ability of more than approx. 150–200 V is capable of carrying a higher current density with a smaller voltage drop between the anode and cathode than a MOS transistor having the same breakdown voltage. In the conducting state, current flows from anode 102 to cathode 101. It is carried by electrons, which are injected into $n^-$-drift region 104 and flow out over $p^+$-emitter 105 on the anode side to anode 102, and it is also carried by holes, which are injected from the $p^+$-emitter on the anode side into $n^-$-drift region 104 and flow over p-regions 107, 108 to cathode 101.

In addition to the planar vertical IGBT structures discussed here, there are also vertical IGBTs having a trench gate, where the gate is created in the form of a trench in the semiconductor surface. In this regard, see I. Omura et al.,

*ISPSD '97, Conf. Proc.*, pp. 217–200. The functioning of these vertical IGBTs having a trench gate is completely similar to that of the structures described above, but they offer the advantage of a lower conducting state voltage drop.

The functioning of the NPT-IGBT or PT-IGBT in the blocking case will be described now. In the blocking case, gate 103 is brought to a voltage below the threshold voltage relative to cathode 101. If anode 102 is then brought to a positive potential, the space charge region, which has developed at the boundary between p-body region 108 and $n^-$-drift region 104, expands almost exclusively into $n^-$-drift region 104.

In the NPT-IGBT, the thickness of $n^-$-drift zone 104 is greater than the width of the space charge region at a given maximum blocking ability of the component. This results in the triangular curve (dotted line) of electric field strength $|E|$ along thickness direction y of the component, as indicated in FIG. 6. The maximum of field strength $|E|$ occurs in the area of MOS control heads 106, 107, 108.

In the PT-IGBT, the thickness of $n^-$-drift zone 104 is selected to be less than the width the space charge region would have at a given maximum blocking ability of the component. To prevent the space charge region from running up onto rear $p^+$-emitter 105, n-doped buffer layer 140 is introduced here with the goal of preventing punch-through. This results in the trapezoidal curve (solid line) of electric field strength $|E|$ indicated in FIG. 6 along thickness direction y of the component. The maximum field strength also occurs here in the area of MOS control heads 106, 107, 108.

FIG. 7 shows a conventional circuit topology in which a vertical IGBT 100 according to FIG. 6 is used as the ignition transistor in the primary circuit of an ignition coil for an internal combustion engine. For this use as an ignition transistor, a V-IGBT having a required blocking ability of approx. 400–600 V has been used in the past.

According to FIG. 7, V-IGBT 100 having main terminal 101 corresponding to the cathode, main terminal 102 corresponding to the anode and control terminal 103 corresponding to the gate is connected to battery voltage $V_{Bat}$ at node 210 via a primary winding of an ignition coil 211. A spark plug 212, a protective resistor 214 of 1–2 kΩ and a diode 213 for suppressing the starting spark are connected on the secondary winding side of ignition coil 211.

V-IGBT 100 is integrated into a circuit system 200 having terminal nodes 201, 202 and 203. Terminal node 202 is connected directly to first main terminal 102 of V-IGBT 100, and terminal node 203, which is at ground GND, is connected directly to second main terminal 101 of V-IGBT 100.

The additional circuit components within circuit system 200 have the function of triggering and clamping V-IGBT 100. Diode 204 has the function of protecting gate 103, which is connected to it, from overvoltages. When conducting, diode 206 prevents current from flowing from control terminal 103 to main terminal 102, which is connected to terminal 152 via the semiconductor material of the V-IGBT. Resistors 207 of 1 kΩ, for example, and resistors 208 of 10–25 kΩ, for example, determine the input resistance of circuit system 200 at terminal node 201 for a control signal ST, and they also form the load of a clamping diode device 205, which is usually designed as a clamping diode chain having a plurality of polysilicon Zener diodes polarized in the reverse direction. Elements 204, 205, 206, 207 and 208 are usually integrated monolithically with the V-IGBT, diodes 204, 206, in addition to element 205, being also normally made of polysilicon.

As outlined here, clamping diode device 205 is not connected directly to the metal plating of anode 102 because it is on the bottom side of the chip and is not readily accessible. Instead, it is in contact with metal plating 152 of channel stopper 155 which has the same potential as anode 102 up to a forward voltage. Circuit system 200 is directly operable by a control unit via terminal node 201. To do so, a control signal ST having a positive voltage of 5 V, for example, is applied to terminal node 201, whereupon a current rise is initiated by ignition coil 211.

At a certain point in time, the voltage on terminal node 201 is reduced to approx. 0 V, whereupon the voltage on metal plating 152 and on main terminal 102 and thus on terminal node 202 rises steeply. The voltage rise is transformed up on the secondary side of ignition coil 211, resulting in an ignition spark on spark plug 212. Clamping diode chain 205 has the function of limiting the voltage rise at main terminal 102 to so-called clamp voltage $V_{KL}$ of approx. 400 V to protect V-IGBT 100 and the other circuit components of circuit system 200. This is important in the pulse case in particular.

A pulse case occurs when no ignition spark is generated, e.g., due to a detached ignition cable. Then circuit system 200 including V-IGBT 100 must absorb the energy which would otherwise be converted into a spark.

FIG. 3 shows a schematic diagram of the time characteristic of the clamping of the anode voltage with conventional circuit system 200.

A time characteristic of voltage $V_A$ at first main terminal 102, i.e., on terminal node 202 is shown in FIG. 3 with dotted line 302. It is assumed here that the ignition switch was switched on for a certain period of time during t<0, so that at time t=0, a current of typically 7 to 20 A is flowing through V-IGBT 100 and ignition coil 211. If V-IGBT 100 is switched off at t=0 due to the reduction in the voltage of triggering signal ST at terminal node 201 to 0 V, then ignition coil 211 is still forcing the full current on it at first.

Then voltage $V_A$ at first main terminal 102 rises steeply. Without voltage limiting, voltage $V_A$ at first main terminal 102 would then rise to the breakdown value of V-IGBT 100 and would destroy it. This is prevented by clamping diode device 205 in that on reaching preselected clamp voltage $V_{KL}$ at time $t_r$ ($t_r$ typically amounts to a few µs), gate 103 of V-IGBT 100 is triggered so sharply that it prevents clamp voltage $V_{KL}$ at main terminal 102 from being exceeded.

If the case is not a pulse case but instead a standard operating case according to solid-line curve 301 in FIG. 3, then voltage $V_A$ at first main terminal 102 would collapse after approx. $t_1-t_r$=15 µs, and after another approx. 15 µs, it would generate the ignition spark on spark plug 212 at $t_f$. The result would be a conversion of the energy stored in ignition coil 211 during sparking period $t_3-t_f$ in the combustion chamber, during which only the inversely transformed spark voltage of approx. $V_B$=30 V would be applied to first main terminal 102 for most of the time period at the end of sparking period $t_3-t_f$ voltage $V_A$ at main terminal 102 would again drop to battery voltage $V_{Bat}$=14 V.

In the pulse case, represented by dotted-line curve 302 in FIG. 3, however, the high clamp voltage of approx. 400 V would persist until time $t_4$, and the current flowing through ignition coil 211 and V-IGBT 100 would subsequently drop linearly over time until time $t_4$. At time $t_4$, the coil energy will have dissipated, i.e., been converted to heat in circuit system 200, and voltage $V_A$ at terminal 102 will drop steeply to battery voltage $V_{Bat}$. Period of time $t_4-t_r$ lasts only a few hundred µs, but this operating case nevertheless makes a high demand on the pulse strength of IGBT 100 due to the high power converted, and this requirement is not always met to an adequate extent. In the worst case this results in destruction of IGBT 100.

J. Yedinak et al. (*ISPSD '98, Conf. Proc.*, pp. 399–402) show, using the example of a PT-IGBT that failure occurs as follows. In the pulse case, the space charge region has included the entire n⁻-drift region 104. Electrons are injected via the MOS channel that has developed into the n⁻-drift region 104 via a triggering of gate 103 controlled by clamping diode 205, these electrons triggering rear p⁺-emitter 105. The component becomes very hot, in particular in the area of cathode 101, due to the high current density, the high electric field strength and the associated high power loss in the area of MOS control heads 106, 107, 108, whereupon an electron leakage current occurs from MOS control heads 106, 107, 108. The electrons run toward anode 102 and notch up p⁺-emitter 105. They thus function like additional triggering of IGBT 100.

To keep the voltage at the level of the clamp voltage, the triggering of gate 103 is reduced accordingly via clamping diode chain 205. Under certain operating conditions, the notch-up due to the thermally induced electron leakage current is so great that V-IGBT 100 is able to carry the load current without gate notch-up. Its controllability is lost. Then the temperature and leakage current of the component continue to rise. Finally, thermal direct feedback occurs and V-IGBT 100 is destroyed. In an investigation of the dependence of the pulse strength of V-IGBTs on the clamp voltage according to Z. J. Shen et al., *IEEE Electron Device Letters*, volume 21, no. 3, March 2000, pp. 119–122, it was found that the pulse strength increases greatly with a decrease in clamp voltage. The reason for this is the reduction in the power converted in V-IGBT 100 due to the drop in clamp voltage; thereby the maximum temperature which occurs in the area of MOS control heads 106, 107, 108 drops during a pulse case.

If we consider standard ignition systems in a motor vehicle, we find that the clamp voltage in such a system is not freely selectable and in particular is not significantly reducible. A significantly reduced clamp voltage would endanger reliable generation of the ignition spark.

An intelligent V-IGBT having current limiting and an over-temperature cutoff is described by Z. J. Shen et al., *PCIM '96, Conf. Proc.*, pp. 11–16, where polysilicon diodes are used as the temperature sensor. In the on-state, the IGBT is shut down on reaching a certain threshold temperature due to the fact that the monolithically integrated control circuit reduces the gate voltage. However, this IGBT is not suitable for use as an ignition transistor because it does not have any clamping. In addition, an overtemperature cutoff by reducing the gate voltage would be counterproductive in the pulse case because it would render ineffective the clamping, which also intervenes via the gate voltage.

An object of the present invention is thus to create an improved semiconductor circuit configuration, in particular for ignition applications, having a semiconductor power switching device which is more protectable in a pulse case.

SUMMARY OF THE INVENTION

The semiconductor circuit configuration according to the present invention, in particular for ignition applications, has the advantage that the semiconductor power switching device is better protectable in a predefinable operating phase without reducing its clamp voltage in another predefinable operating phase. The circuits required for triggering the determination of the time phases according to the present invention may advantageously be monolithically integratable into the semiconductor power circuit device.

The idea on which the present invention is based is that the clamping diode device has a first part having a first clamp voltage and a second part having a second clamp voltage, the second part being connected in series with the first part. In addition, a controllable semiconductor switching device, which is connected in parallel with the first part, is provided for controllable bridging of the first part, so that either the sum of the first and second clamp voltages, or the second clamp voltage is provided for clamping the external voltage applied at the first main terminal. A control circuit is used to control the controllable semiconductor switching device as a function of a predetermined operating state of the semiconductor power switching device.

According to a preferred refinement, the predetermined operating state is an operating temperature of the semiconductor power switching device.

According to another preferred refinement, a temperature sensor is provided for detecting the operating temperature of the semiconductor power switching device, and the control circuit is designed so that it triggers the semiconductor switching device for bridging when the operating temperature of the semiconductor power switching device exceeds a predetermined temperature.

According to another preferred refinement, the predetermined operating state is a state which prevails after a predetermined time lag after a change in state of a control signal applied to the control terminal.

According to another preferred refinement, the control circuit has a timing element for detecting the time lag after the change in state and is designed so that it triggers the semiconductor switching device for bridging when the detected time lag exceeds the predetermined time lag.

According to another preferred refinement, the controllable semiconductor switching device is a second NMOS transistor whose control terminal is connected to the first main terminal across a resistance device and parts of the semiconductor chip.

According to another preferred refinement, a voltage converting device is provided between the control circuit and the controllable semiconductor switching device, having a first NMOS transistor whose first main terminal is connected to the control terminal of the second NMOS transistor across two diodes in antiserial connection, and the control circuit is connected via its second terminal and control terminal.

According to another preferred refinement, the semiconductor power switching device is a vertical IGBT having: a rear emitter region of a second type of conduction, a drift region of the first type of conduction and a rear anode contact as the first main terminal; an optional buffer region between the drift region and the rear emitter region; a front MOS control structure having a front source region and a body region which are introduced into the drift region, and a control contact as the control terminal, situated with insulation above the body region and a portion of the drift region connected to it; a front cathode contact which is connected to the front source region and the body region; the clamping diode device, the semiconductor switching device, and the control circuit being integrated on the front side between an active region and an edge termination metal plating of the semiconductor power switching device.

DETAILED DESCRIPTION

The same reference numbers in the figures denote the same components or those having the same function.

Figure 1:
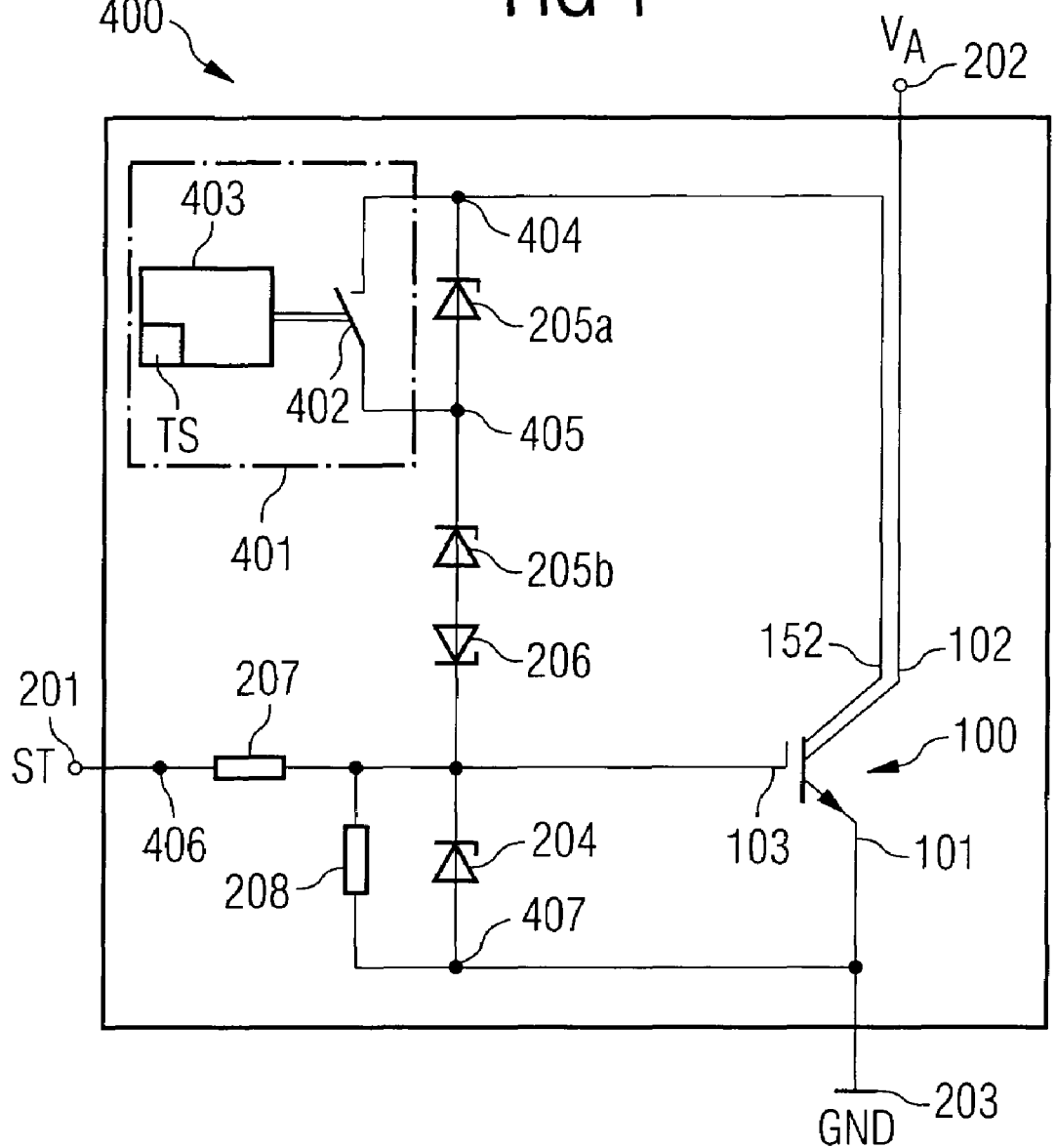
FIG. 1 shows a schematic cross-sectional diagram of a semiconductor circuit configuration for ignition applications according to a first embodiment of the present invention.

FIG. 1 shows a schematic cross-sectional diagram of a semiconductor circuit configuration for ignition applications according to a first embodiment of the present invention.

FIG. 1 shows in general a semiconductor circuit configuration 400 for ignition applications according to the first embodiment having a special circuit 401 in the area of clamping diode device 205a, 205b, which is connected via metal plating 152 between first main terminal 102 and control terminal 103. FIG. 1 shows certain circuit nodes 404, 405, 406, 407 to which reference will be made below.

Clamping diode device 205a, 205b has a first chain part 205a having a first clamp voltage between circuit nodes 404, 405 and a second chain part 205b having a second clamp voltage, second part 205b being connected in series with first part 205a.

In addition, a controllable semiconductor switching device 402 is connected in parallel with first part 205a and is provided for controllable bridging of first part 205a, so that either the sum of the first and second clamp voltages or the second clamp voltage is provided for clamping external voltage $V_A$ applied to first main terminal 102.

A control circuit 403 is used for controlling controllable semiconductor switching device 402 as a function of a predetermined operating state of the semiconductor power switching device in the form of V-IGBT 100.

Figure 3:
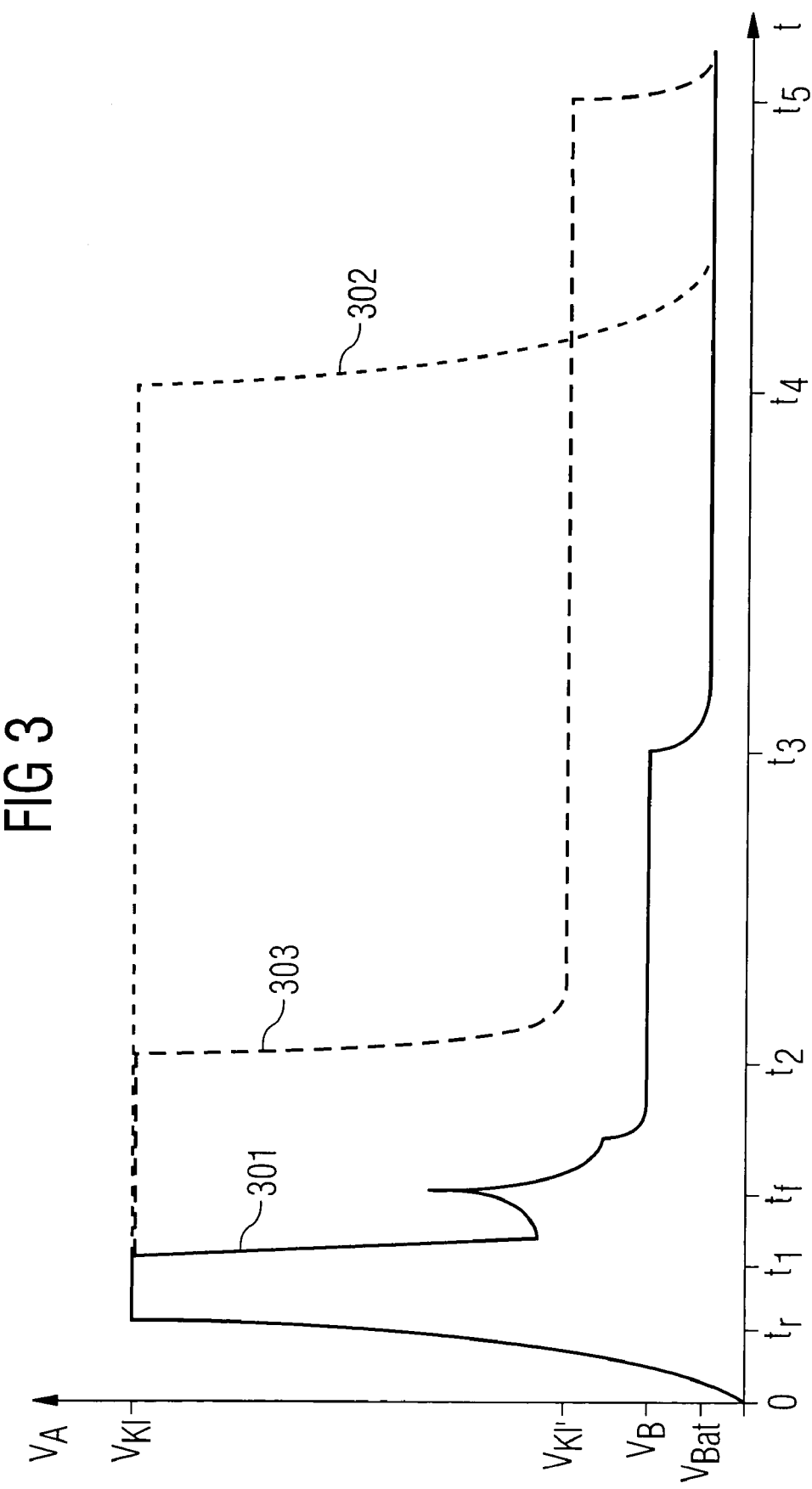
FIG. 3 shows a schematic diagram of the time characteristic of the clamping of the anode voltage of the semiconductor power switching device in the usual semiconductor circuit configuration for ignition applications and in the embodiments of the present invention.

In particular, a clamping response may be imparted to the circuit system according to the present embodiment by this special wiring, as illustrated by dotted-line curve 303 in FIG. 3.

The essential idea in this first embodiment is to switch the clamp voltage at a point in time $t_2 > t_f$ after spark production from the high level of $V_{KL} = 400$ V to a much lower level $V_{KL}'$. This lower clamp voltage $V_{KL}'$ is preferably above inversely transformed sparking voltage $V_B$ so as not to interfere with the sparking process in standard operation. For example, a value of $V_{KL}' = 50$ V would be a reasonable value. The point in time $t_2$ is preferably selected to be as soon as possible after spark generation at time $t_f$. The reduction in clamp voltage after the spark has been produced ensures reliable spark production by retaining a high clamp voltage $V_{KL}$ in the spark generation phase, while on the other hand greatly reducing the power loss in V-IGBT 100 and greatly reducing the heat generated in the pulse case and thereby increasing its pulse strength. As shown clearly in FIG. 3, the dissipation of the energy stored in ignition coil 211 is spread over a larger interval of time, which ends at point in time $t_5$.

Figure 7:
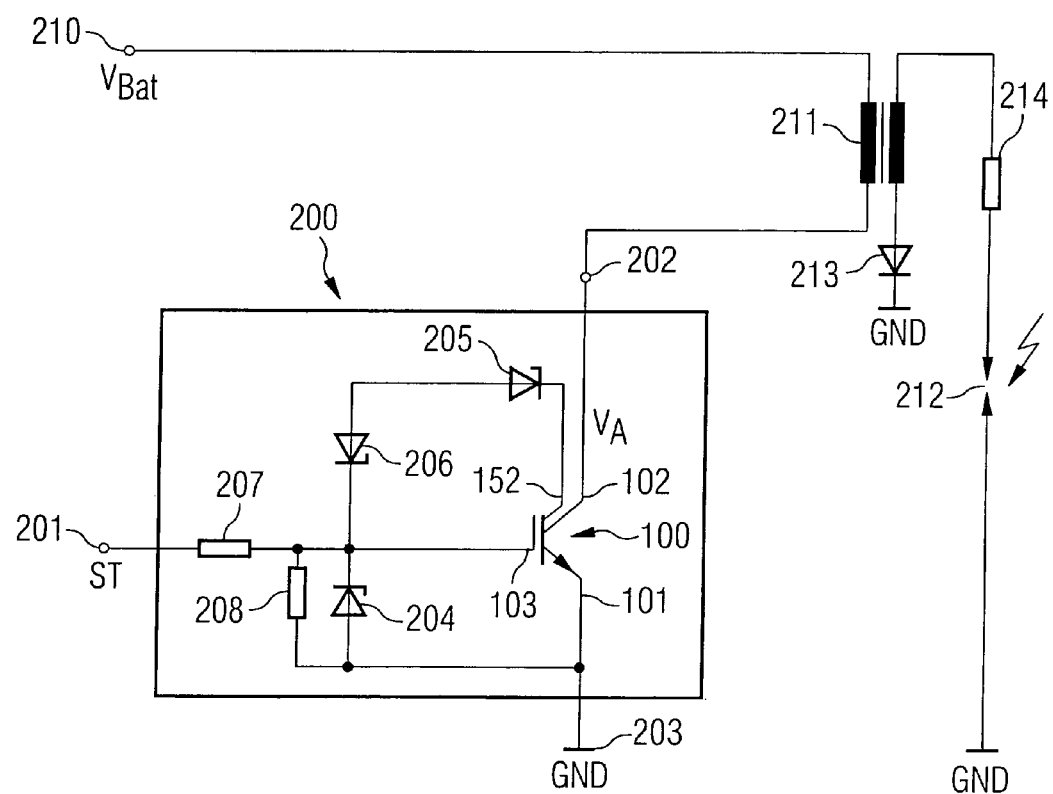
FIG. 7 shows a conventional circuit topology using a vertical IGBT as the ignition transistor in the primary circuit of an ignition coil for an internal combustion engine.

According to this embodiment, this behavior is achievable by the fact that clamping diode chain 205 according to FIG. 7, which is known per se, is divided into a high-blocking part 205a having a breakdown voltage of 350 V, for example, and a low-blocking part 205b having a breakdown voltage of 50 V, for example, high-blocking part 205a being bridgeable with semiconductor switching device 402. When switching device 402 is open, full clamp voltage $V_{KL} = 400$ V prevails, and when switching device 402 is closed, a reduced clamp voltage $V_{KL}'$ prevails.

The switching state of switching device 402 may be selected by a suitably designed control circuit 403 according to predetermined criteria. For example, in the first embodiment, temperature is controlled on the basis of the chip temperature using a temperature sensor TS.

In the case of the temperature-controlled circuit version, switching device 402 is initially open at $t=0$. When the chip temperature detected by the temperature sensor exceeds a predetermined temperature value because a pulse case is present, switching device 402 is closed by control circuit 403, so the clamp voltage is reduced to voltage $V_{KL}'$ by the end of the pulse case. This end may also be detected on the basis of the temperature, e.g., the temperature falling below a predetermined temperature value, or it may be defined automatically after a predetermined period of time has elapsed.

Temperature sensor TS, which is necessary for such a temperature-dependent control, may be formed by polysilicon diodes, for example, whose temperature-dependent forward voltage is analyzed (see Z. J. Shen et al., *PCIM '96, Conf. Proc.*, pp. 11–16). In addition, it is also conceivable to analyze the temperature-dependent blocking current of pn junctions or the temperature-dependent threshold voltage of MOS transistors used as temperature sensor TS. Temperature sensor TS is preferably situated at the center of active region 130 because the chip is hottest there. If a certain temperature gradient is taken into account, however, placement at a distance from the center of the chip, i.e., active region 130, is also possible with a suitable design of the analysis in control circuit 403. The power supply of temperature sensor TS together with particular control circuit 403 may be derived, for example, from the anode voltage or from circuit nodes 405, 406 according to the related art.

Figure 2:
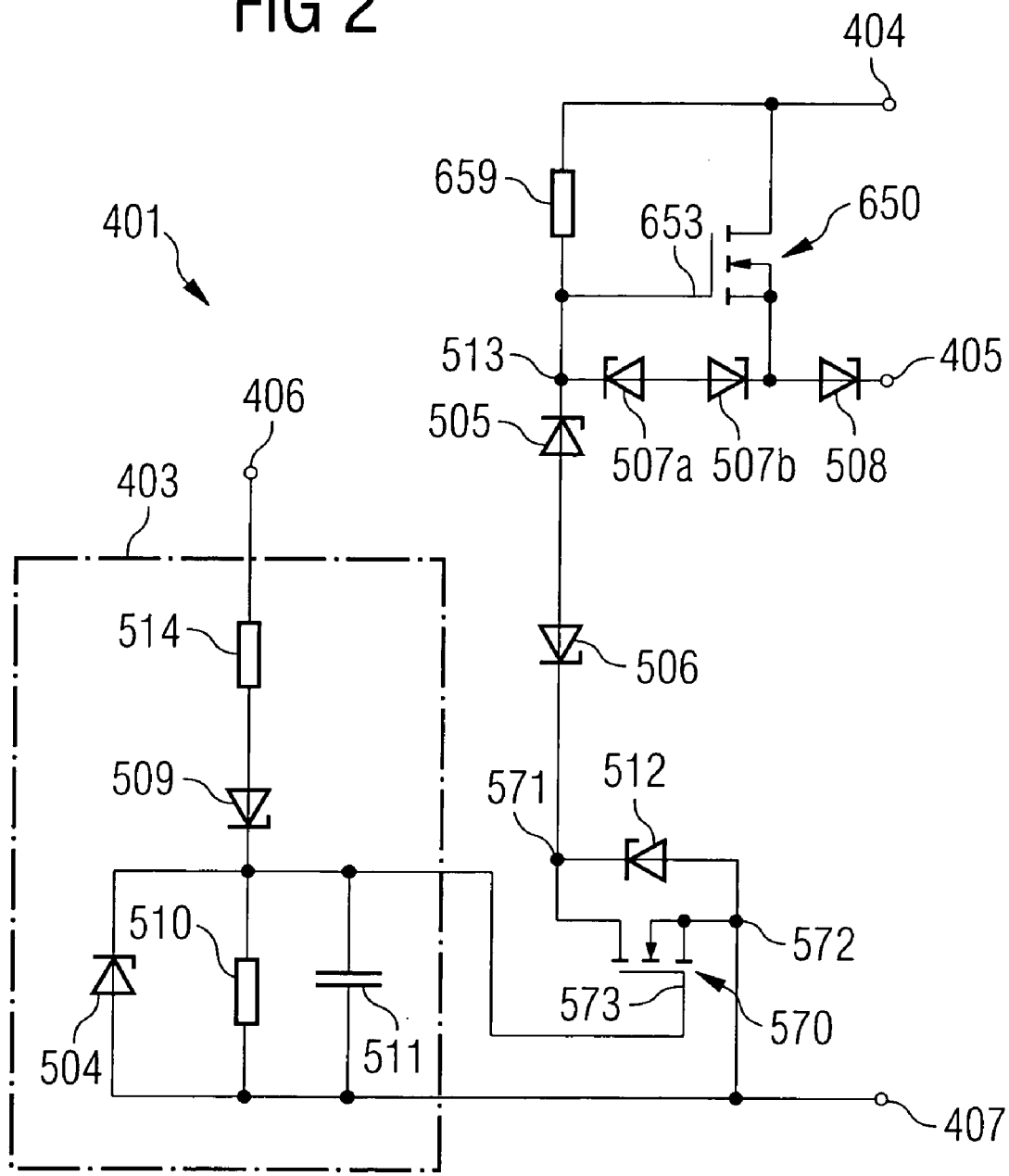
FIG. 2 shows a schematic cross-sectional diagram of a control part and switching part of the semiconductor circuit configuration for ignition applications according to a second embodiment of the present invention.

FIG. 2 shows a schematic cross-sectional diagram of control and switching part 401 of the semiconductor circuit configuration for ignition applications according to a second embodiment of the present invention.

In the second embodiment, there is a time-controlled selection of the switching state of switching device 402 according to FIG. 1, although that is implemented here by NMOS transistor 650 having control terminal 653, the additional circuit part outside of block 403 being a voltage level converter.

In general, switching device 402 is also open at time $t=0$ in time-controlled selection. Switching device 402 is closed and the clamp voltage is reduced to $V_{KL}'$ at a predetermined time $t_2$ after turning off the voltage of triggering signal ST at terminal node 201 at t=0.

Special control circuit 403 according to FIG. 2 includes an RC timing element composed of a resistor 510 and a capacitor 511, the latter optionally being formed by a polysilicon electrode separated from the semiconductor only by thin gate oxide 109. The RC timing element is charged during time t<0 from the positive voltage of triggering signal ST applied at terminal node 207 up to a maximum equal to the voltage defined by diode 504 via diode 509 and decoupling resistor 514.

A first NMOS transistor 570 having a first and second main terminals 571 and 572, respectively, and a control terminal 573 is switched on during time t<0. At time t=0, V-IGBT 100 is switched off by applying 0 V at terminal node 201. Circuit node 406 is then also at 0 V, and diode 509 prevents a sudden discharge of the RC timing element, which is why first NMOS transistor 570 remains turned on initially.

Due to the shutdown of the voltage at terminal node 201, voltage $V_A$ at main terminal 102 increases up to high clamp voltage $V_{KL}$ of 400 V. Approximately this clamp voltage $V_{KL}$ is also applied to metal plating 152 and consequently to circuit node 404, while approximately the lower clamp voltage $V_{KL}'$ is applied at node 405 and at node 513. The breakdown voltage of diode 505 should therefore be selected to be identical to that of second partial diode change 205b. In addition, gate protective diodes 507a, 507b are to be provided for a second NMOS transistor 650 which is situated in the edge area of the IGBT chip and remains blocked initially.

Capacitor 511 of the RC timing element is subsequently discharged across resistor 510, which results in shutdown of first NMOS transistor 570 at predetermined time $t=t_2$. Due to the current flow across polysilicon resistor 659, which has a high voltage strength and is situated in a meandering pattern in the V-IGBT edge area, for example, the voltage at node 513 increases and notches up the second NMOS transistor 650. Since this corresponds to switch element 402 in FIG. 1, high-blocking part 205a of the clamping diode chain is then bridged, and consequently the clamp voltage is reduced to $V_{KL}'$.

In principle all the components used in the circuit system explained here according to the first and/or second embodiment are monolithically integratable with V-IGBT 100.

Figure 4:
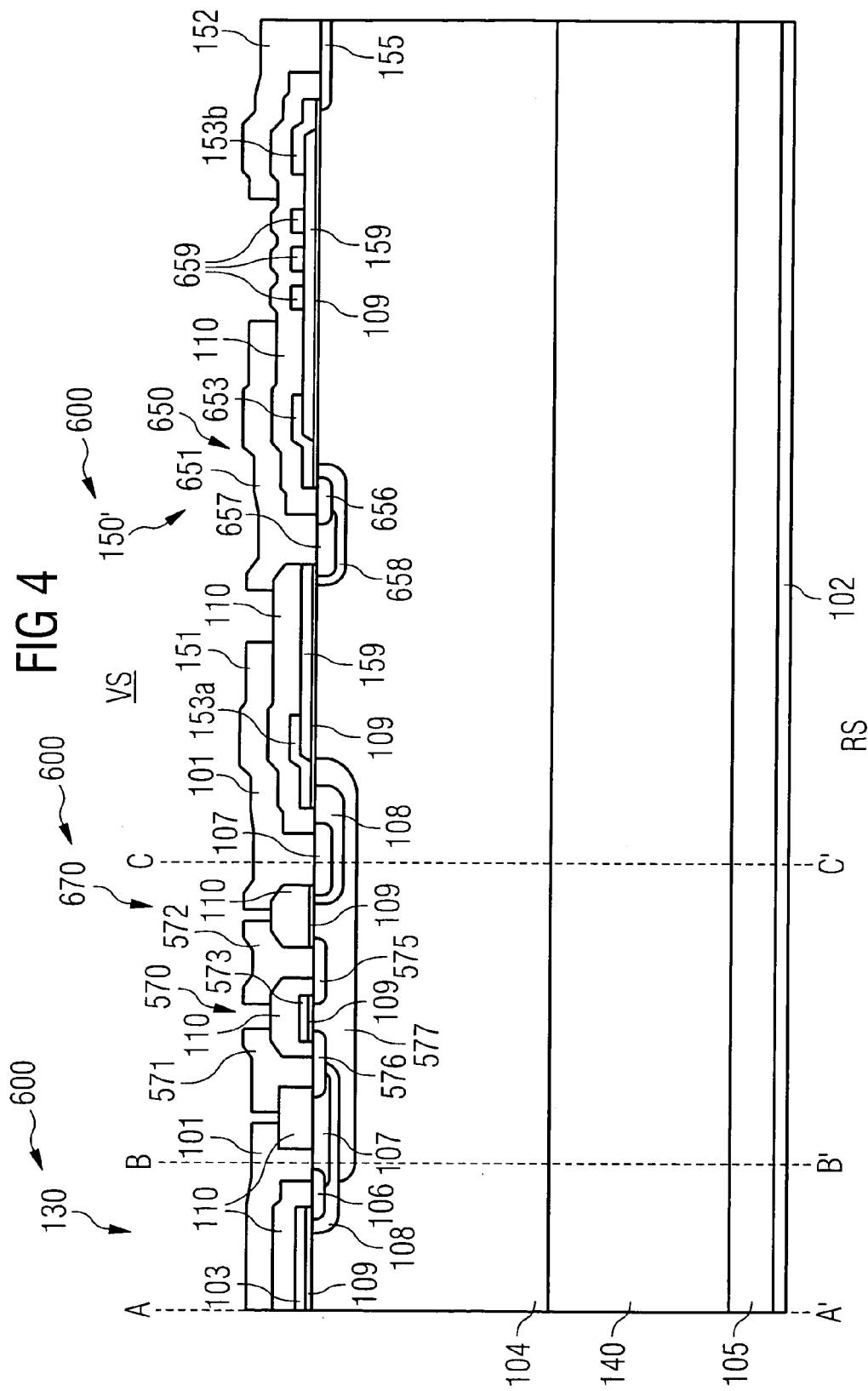
FIG. 4 shows a schematic cross-sectional diagram of an integrated circuit for the semiconductor circuit configuration for ignition applications according to the embodiments of the present invention.

FIG. 4 shows a schematic cross-sectional diagram of an integrated circuit embodiment of the semiconductor circuit configuration for ignition applications according to the embodiments of the present invention.

FIG. 4 shows in general an integrated circuit system 600 having an active region 130, a logic circuit region 670 and an edge termination region 150', n-buffer layer 140 being optional.

Figure 6:
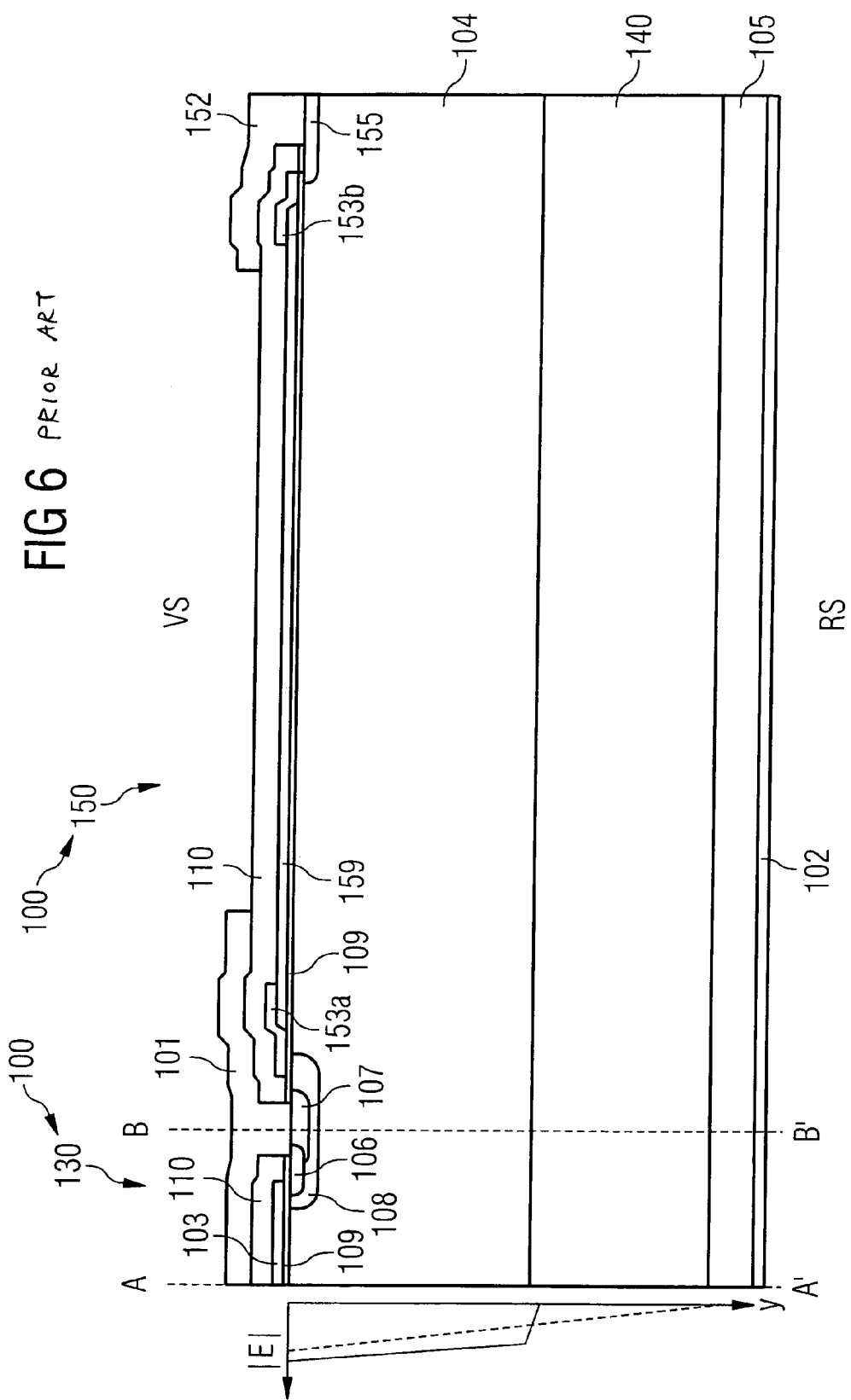
FIG. 6 shows a schematic cross-sectional diagram of a known NPT-IGBT and PT-IGBT.

The known edge termination having components 152, 153b, 155 according to FIG. 6 is supplemented by the addition of high voltage resistant polysilicon meandering resistor 659, and second NMOS transistor 650 according to FIG. 2.

Second NMOS transistor 650 has a source metal plating 651, which is equipped with a magnetoresistor and an associated polysilicon gate 653 to achieve a high blocking ability. Also shown is an n⁺-source region 656, a p⁺-contact diffusion 657, and a body region 658 on whose surface, which is situated beneath gate 653, an inversion channel may be created.

First NMOS transistor 570 is shown in the logic region having p-logic trough 577 situated between sections BB' and CC' as representative of the other components that may be shown. This transistor has a source metal plating 571, an n⁺-source region 576, an n⁺-drain metal plating 572, an n⁺-drain region 575 and a gate electrode 573. An associated p-trough 577 is also shown.

To have a greater freedom in the wiring, n⁺-source region 576 is contactable individually via source metal plating 521 and is not short-circuited to p-trough 577. p-trough 577 is at the same potential as cathode region 101, 107, 108 of the V-IGBT. It therefore captures holes emitted by emitter 105 on the anode side. To ensure the most interference-free possible functioning of the logic, p-logic trough 577 should be connected to cathode 101 via p⁺-contact diffusion 107 at the largest possible number of points. According to an optimum embodiment, each individual NMOS transistor is enclosed completely in the form of a ring with p⁺-contact diffusions and body diffusions 107, 108, which are connected to 101, as diagramed in the cross section according to FIG. 4.

Figure 5:
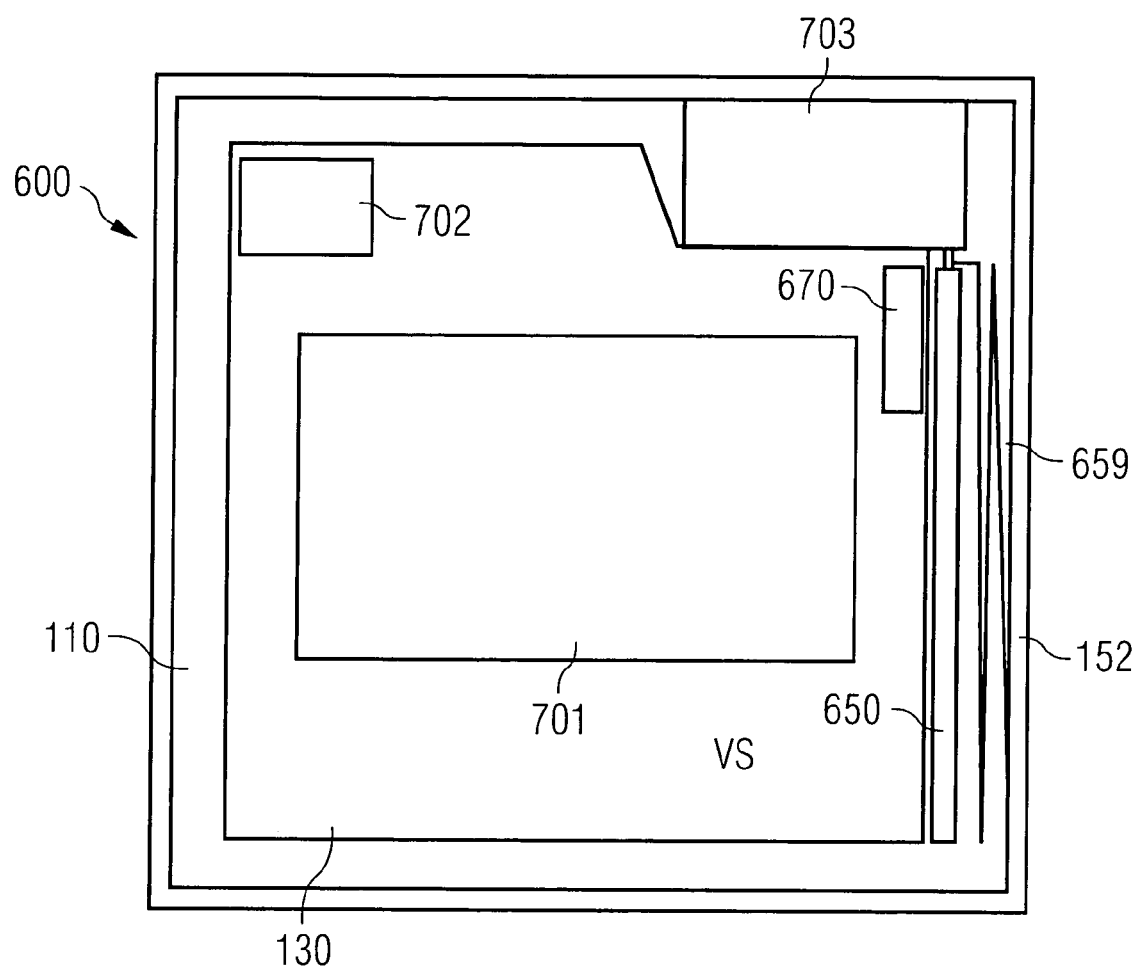
FIG. 5 shows a schematic top view of the integrated circuit for the semiconductor circuit configuration for ignition applications according to the embodiments of the present invention.

FIG. 5 shows a schematic top view of the integrated circuit of the semiconductor circuit configuration for ignition applications according to the embodiments of the present invention.

In addition to the reference notation already introduced, FIG. 5 shows a region 703 in which polysilicon diode chains 205a, 205b, 505 and 506 are situated. A metallic gate bond land 702 is connected electrically to gate 103. A cathode bond land 701 is a partial region of the cathode metal plating of cathode 101 in active portion 130 of the V-IGBT.

Although the present invention has been described above on the basis of a preferred exemplary embodiment, it is not limited to this embodiment, but may instead be modified in a variety of ways.

Although the present invention has been explained on the example of a planar n-channel PT-IGBT, it may be applied in principle to other power switching devices such as planar p-channel PT-IGBTs, planar NPT-IGBTs, trench PT-IGBTs, trench NPT-IGBTs, SPT-IGBTs, MOS transistors having a planar gate or trench gate, etc.

If the types of doping and the sign of the voltage to be applied are switched, for example, this yields a corresponding p-channel IGBT from the n-channel IGBT. In general, this version is superior to the n-channel NPT-IGBT with regard to the latch-up strength but is inferior with regard to the avalanche strength.

Representation of RC timing elements having time constants in the μs range is space intensive. An alternative which could also be integrated would be to use a multivibrator having a downstream frequency divider, e.g., in NMOS resistance logic instead of the RC timing element in the control circuit. The exemplary embodiments of switched clamping explained above may also be refined in another embodiment not shown here. To do so, the case in which it is impossible to generate several sparks in series is considered. In this case of a longer pulse train according to curve 303 in FIG. 3, the average power loss increases in comparison with a train of pulses according to curve 302 in FIG. 3. To prevent the resulting damage in the structure and joining of the circuit system, a warning signal should therefore be generated by an additional logic unit in this type of operation to suppress further output stage triggering.

For example, at a time t, which is between time $t_2$ and time $t_5$, an inquiry may be made of node 405 or gate terminal 103 regarding the voltage state. If the voltage state is above a certain threshold level so that it indicates a pulse case according to curve 303 in FIG. 3, then either the next positive triggering signal at node 406 may be suppressed directly or an entry may be made in an error counter which suppresses additional positive triggering signals at node 406 only on reaching a certain number of pulses according to curve 303 in FIG. 3.

The required logic and the error counter which may also be required, may also be integrated monolithically in the usual manner and/or situated externally.

| List of Reference Notation | |
|---|---|
| VS, RS | front side, rear side |
| AA', BB', CC' | cross sections |
| 102 | anode terminal |
| 101 | cathode terminal |
| 105 | rear p$^+$-emitter |
| 140 | n-buffer layer |
| 104 | n$^-$-drift region |
| 109 | gate oxide |
| 108 | p-body region |
| 106 | n$^+$-source region |
| 107 | p$^+$-contact region |
| 103 | gate terminal |
| 110 | intermediate dielectric |
| 130 | active region |
| 150 | edge area |
| 153a | polysilicon magnetoresistor |
| 153b | polysilicon magnetoresistor |
| 152 | metal plating |
| 155 | channel stopper |
| 159 | field oxide |
| E | field strength |
| y | thickness direction |
| 200, 400 | circuitry |
| 201, 202, 203 | terminal node |
| 204, 206 | diodes |
| 205 | clamping diode chain |
| 205a, 205b | partial clamping diode chains |
| 207, 208 | resistors |
| GND | ground |
| V$_A$ | voltage on 102 |
| 100 | V-IGBT |
| 210 | node for V$_{Bat}$ |
| 211 | ignition coil |
| 213 | diode |
| 214 | resistor |
| 212 | spark plug |
| ST | control signal |
| 401 | additional wiring |
| 402 | switching device |
| 403 | control circuit |
| TS | temperature sensor |
| 404, 405, 406, 407 | circuit node |
| 514 | resistor |
| 509, 504 | diode |
| 510, 511 | RC timing element |
| 570 | first NMOS transistor |
| 571, 572, 573 | terminals of 570 |
| 505, 506, 507a/b, 508, 512 | diode |
| 513 | node |
| 650 | second NMOS transistor |
| 653 | control terminal of 650 |
| 301, 302, 303 | clamping curves |
| t | time |
| V$_B$ | feedback operating voltage |
| V$_{KL}$, V$_{KL}$' | clamp voltage |
| 575, 576 | source, drain of 570 |
| 577 | p-trough of 570 |
| 651 | source metal plating of 650 |
| 657, 658 | contact diffusion and body of 650 |
| 656 | source of 650 |
| 701 | cathode bond land |
| 702 | gate bond land |
| 703 | diode chain region |

The invention claimed is:

1. A semiconductor circuit configuration, comprising:
a semiconductor power switching device that includes a first main terminal, a second main terminal, and a control terminal;
a clamping diode device connected between the first main terminal and the control terminal and for clamping an external voltage applied to the first main terminal, wherein the clamping diode device includes:
a first part possessing a first clamp voltage, and
a second part possessing a second clamp voltage and connected in series to the first part;
a controllable semiconductor switching device connected in parallel to the first part for producing a controllable bridging of the first part, so that one of the second clamp voltage and a sum of the first clamp voltage and the second clamp voltage is provided for clamping the external voltage;
a control circuit for controlling the controllable semiconductor switching device as a function of a predetermined operating state of the semiconductor power switching device, wherein the predetermined operating state is an operating temperature of the semiconductor power switching device; and
a temperature sensor for detecting the operating temperature of the semiconductor power switching device, wherein:
the control circuit triggers the controllable semiconductor switching device when the operating temperature exceeds a predetermined temperature.

2. The semiconductor circuit configuration as recited in claim 1, wherein:
the semiconductor circuit configuration is for an ignition application.

3. The semiconductor circuit configuration as recited in claim 1, wherein:
the predetermined operating state is a state that prevails after a predetermined time lag following a change in state of a control signal applied at the control terminal.

4. The semiconductor circuit configuration as recited in claim 3, wherein:
the control circuit includes a timing element for detecting a time lag after the change in state, and
the control circuit triggers the controllable semiconductor switching device when the time lag exceeds the predetermined time lag.

5. A semiconductor circuit configuration, comprising:
a semiconductor power switching device that includes a first main terminal, a second main terminal, and a control terminal;
a clamping diode device connected between the first main terminal and the control terminal and for clamping an external voltage applied to the first main terminal, wherein the clamping diode device includes:
a first part possessing a first clamp voltage, and
a second part possessing a second clamp voltage and connected in series to the first part;
a controllable semiconductor switching device connected in parallel to the first part for producing a controllable bridging of the first part, so that one of the second clamp voltage and a sum of the first clamp voltage and the second clamp voltage is provided for clamping the external voltage;
a control circuit for controlling the controllable semiconductor switching device as a function of a predetermined operating state of the semiconductor power switching device; and a resistance device, wherein:
  the controllable semiconductor switching device includes a first NMOS transistor, and
  a control terminal of the first NMOS transistor is connected to the first main terminal across the resistance device.

6. The semiconductor circuit configuration as recited in claim 5, further comprising:
  a voltage converting device arranged between the control circuit and the controllable semiconductor switching device, wherein:
    the voltage converting device includes a second NMOS transistor,
    a first main terminal of the second NMOS transistor is connected to the control terminal of the first NMOS transistor, and
    the control circuit is connected via a second main terminal and a control terminal of the second NMOS transistor.

7. A semiconductor circuit configuration, comprising:
  a semiconductor power switching device that includes a first main terminal, a second main terminal, and a control terminal;
  a clamping diode device connected between the first main terminal and the control terminal and for clamping an external voltage applied to the first main terminal, wherein the clamping diode device includes:
    a first part possessing a first clamp voltage, and
    a second part possessing a second clamp voltage and connected in series to the first part;
  a controllable semiconductor switching device connected in parallel to the first part for producing a controllable bridging of the first part, so that one of the second clamp voltage and a sum of the first clamp voltage and the second clamp voltage is provided for clamping the external voltage; and
  a control circuit for controlling the controllable semiconductor switching device as a function of a predetermined operating state of the semiconductor power switching device;
  wherein the semiconductor power switching device includes a vertical IGBT having:
    a rear emitter region of a first type of conduction,
    a drift region of a second type of conduction,
    a rear anode contact as the first main terminal,
    an optional buffer region arranged between the drift region and the rear emitter region,
    a front MOS control structure having:
      a front source region and a body region that are introduced into the drift region, and
      a control contact as the control terminal that is situated above the body region and above a portion of the drift region adjacent thereto, the control contact being insulated, and
    a front cathode contact that is connected to the front source region and the body region, wherein the clamping diode device, the controllable semiconductor switching device, and the control circuit are integrated on a front side between an active region and a metal edge-termination plating of the semiconductor power switching device.

* * * * *